(12) United States Patent
Price et al.

(10) Patent No.: US 10,635,168 B2
(45) Date of Patent: Apr. 28, 2020

(54) MEMS LINE SCANNER AND SILICON PHOTOMULTIPLIER BASED PIXEL CAMERA FOR LOW LIGHT LARGE DYNAMIC RANGE EYE IMAGING

(71) Applicant: Microsoft Technology Licensing, LLC, Redmond, WA (US)

(72) Inventors: Raymond Kirk Price, Redmond, WA (US); Kai Zang, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 232 days.

(21) Appl. No.: 15/683,172

(22) Filed: Aug. 22, 2017

(65) Prior Publication Data
US 2019/0064922 A1 Feb. 28, 2019

(51) Int. Cl.
*H04N 3/00* (2006.01)
*G06F 3/01* (2006.01)
*H01L 27/144* (2006.01)
*H01L 31/028* (2006.01)
*H01L 31/107* (2006.01)
*H01L 31/02* (2006.01)
(Continued)

(52) U.S. Cl.
CPC .............. *G06F 3/013* (2013.01); *G01J 1/44* (2013.01); *G01J 1/46* (2013.01); *H01L 27/1446* (2013.01); *H01L 31/028* (2013.01); *H01L 31/02027* (2013.01); *H01L 31/107* (2013.01)

(58) Field of Classification Search
CPC ......... G01S 7/4861; H04N 3/09; H04N 3/155
USPC .......................... 250/214 R, 214 SW, 214 LS
See application file for complete search history.

(56) References Cited

U.S. PATENT DOCUMENTS

| 8,426,866 B2 | 4/2013 | Kimura et al. |
| 9,154,713 B2 | 10/2015 | Denham et al. |
| 9,341,908 B2 | 5/2016 | Kimura |

(Continued)

FOREIGN PATENT DOCUMENTS

| DE | 102010013751 A1 | 10/2011 |
| EP | 2182379 A1 | 5/2010 |

(Continued)

OTHER PUBLICATIONS

Hofmann, et al., "High-Q MEMS resonators for laser beam scanning displays", In Journal of Micromachines, vol. 3, Dec. 2012, pp. 509-528.

(Continued)

*Primary Examiner* — Kevin K Pyo
(74) *Attorney, Agent, or Firm* — Ray Quinney & Nebeker P.C.; John O. Carpenter

(57) ABSTRACT

A light sensing circuit includes a photomultiplier in electrical communication with an array of capacitors or resistors. Each capacitor or resistor in the array having an associated switch and having a capacitance or resistance different from every other capacitor or resistor in the array. Each switch has an open state and a closed state, thus enabling each capacitor or resistor to be placed in electrical communication with the photomultiplier or be isolated from the photomultiplier. The switchable array may be in electrical communication with an analog to digital converter (ADC) or a transimpedance amplifier (TIA). The switchable array allows the ADC or TIA to be sensitive to low value signals and operate at a large dynamic range and operate at a fast rate.

20 Claims, 10 Drawing Sheets

(51) Int. Cl.
   *G01J 1/44* (2006.01)
   *G01J 1/46* (2006.01)

(56) References Cited

U.S. PATENT DOCUMENTS

| | | |
|---|---|---|
| 2008/0001850 A1 | 1/2008 | Champion et al. |
| 2011/0315856 A1* | 12/2011 | O'mathuna ............... G01T 1/00 |
| | | 250/208.2 |
| 2016/0202117 A1 | 7/2016 | Hosking |
| 2016/0255318 A1 | 9/2016 | Chevallaz et al. |

FOREIGN PATENT DOCUMENTS

| | | |
|---|---|---|
| EP | 2750376 A2 | 7/2014 |
| WO | 2006085834 A1 | 8/2006 |

OTHER PUBLICATIONS

Freeman, et al., "Scanned Laser: Pico-Projectors: Seeing the Big Picture (with a Small Device)", In Journal of Optics and Photonics News, vol. 20, No. 5, May 1, 2009, pp. 28-34.

"International Search Report and Written Opinion Issued in PCT Application No. PCT/US2018/038700", dated Sep. 14, 2018, 12 Pages.

* cited by examiner

MEMS LINE SCANNER AND SILICON PHOTOMULTIPLIER BASED PIXEL CAMERA FOR LOW LIGHT LARGE DYNAMIC RANGE EYE IMAGING

CROSS-REFERENCE TO RELATED APPLICATIONS

N/A

BACKGROUND

Virtual reality (VR) and mixed reality (MR) display systems allow a user to experience visual simulations presented from a computer. Some visual simulations are interactive and allow the user to interact with the simulated environment.

Imagers use light to collect an image of an object. Imagers are used to increase the interaction of a user with the visual simulations provided by the VR or MR display systems. An imager can image the user's eye to measure the direction of the user's view. Imaging the eye in various lighting environments and with various lighting sources can present challenges to a compact imager or imagers positioned in the VR or MR head-mounted display.

The subject matter claimed herein is not limited to embodiments that solve any disadvantages or that operate only in environments such as those described above. Rather, this background is provided only to illustrate one exemplary technology area where some embodiments described herein may be practiced.

BRIEF SUMMARY

In some embodiments, a light-sensing circuit includes a solid state silicon photomultiplier and a switchable array. The switchable array includes a first capacitor, a second capacitor, a first electrical switch, and a second electrical switch. The first capacitor and second capacitor are in electrical parallel. The first capacitor has a first capacitance, and the second capacitor has a second capacitance different from the first capacitance. The first electrical switch is associated with the first capacitor and the second electrical switch is associated with the second capacitor. Each electrical switch has an open state and a closed state where the closed state provides electrical communication between the solid state silicon photomultiplier and the associate capacitor.

In other embodiments, a light-sensing circuit includes a solid state silicon photomultiplier and a switchable array. The switchable array includes a first resistor, a second resistor, a first electrical switch, and a second electrical switch. The first resistor and second resistor are in electrical parallel. The first resistor has a first resistance, and the second resistor has a second resistance different from the first resistance. The first electrical switch is associated with the first resistor and the second electrical switch is associated with the second resistor. Each electrical switch has an open state and a closed state where the closed state provides electrical communication between the solid state silicon photomultiplier and the associate resistor.

In yet other embodiments, a method for sensing light includes emitting light toward an object using a light emission device and detecting photons reflected off the object using a solid state silicon photomultiplier. The method further includes outputting current from the photomultiplier to a switchable array, toggling to a closed state a single switch in the switchable array, and reading an output signal from the switchable array This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

This disclosure generally relates to imaging apparatuses, systems, and methods. More particularly, this disclosure generally relates to eye-imaging apparatuses, systems, and methods. While the present disclosure illustrates and described the imaging apparatuses, systems, and methods in relation to eye-imaging, it should be understood that the detection circuitry described herein can also be applied to active imaging systems such as LIDAR, Scanning MEMS Imaging systems, or other active illumination systems that characterize with a single monitor photodiode response.

Disclosed embodiments include, but are not limited to, head mounted displays that have an imaging system that may be used for eye imaging and tracking. The disclosed embodiments provide techniques and systems to increase the dynamic range and reduce the quantization error of an imaging system while still operating at a high frame rate.

Figure 1:
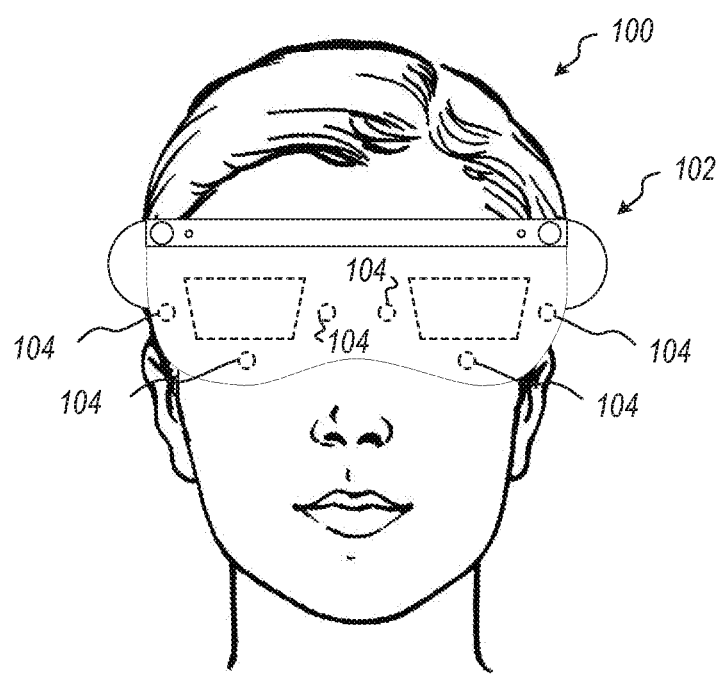
FIG. 1 is a perspective view of an embodiment of a head-mounted display (HMD) with an imager, according to at least one embodiment of the present disclosure.

For example, FIG. 1 is a front view of a user 100 wearing a head-mounted device (HMD) 102. The HMD 102 may include a display through which infrared active illumination light may be transmitted to the user's eyes, around which one or more sensors/silicon photomultipliers (SiPM) 104 may be located to detect the reflected IR light. The one or more sensors/SiPM 104 may be positioned adjacent to a display and oriented toward the eyes of the user 100 to image the position and/or orientation of the eyes. In some embodiments, the sensors/SiPMs 104 may be positioned between the eyes, outside the eyes, below the eyes, above the eyes, or any combinations thereof. In some examples, the position and orientation of the sensors/SiPM 104 may be symmetrical about a center of the HMD 102. In other words, the sensors/SiPM 104 used to image the left eye and right eye of the user 100 may be the same. In other examples, the sensors/SiPM 104 may be asymmetrical about the center of the HMD 102. In at least one example, a sensor/SiPM 104 may be movable within a frame of the HMD 102, such that position and/or orientation of the sensor/SiPM 104 may be customized to the user 100.

Using a sensor/SiPM 104 in an HMD 102 to image an eye of a user 100 or to track the movement of an eye presents unique challenges not faced by conventional imaging systems. For example, an illumination used to image a human eye must operate with a limited power budget due to safety concerns. Also, by way of example, an sensor/SiPM 104 operating in connection with an HMD 102 may have power restrictions because battery power may be limited.

Figure 2A:
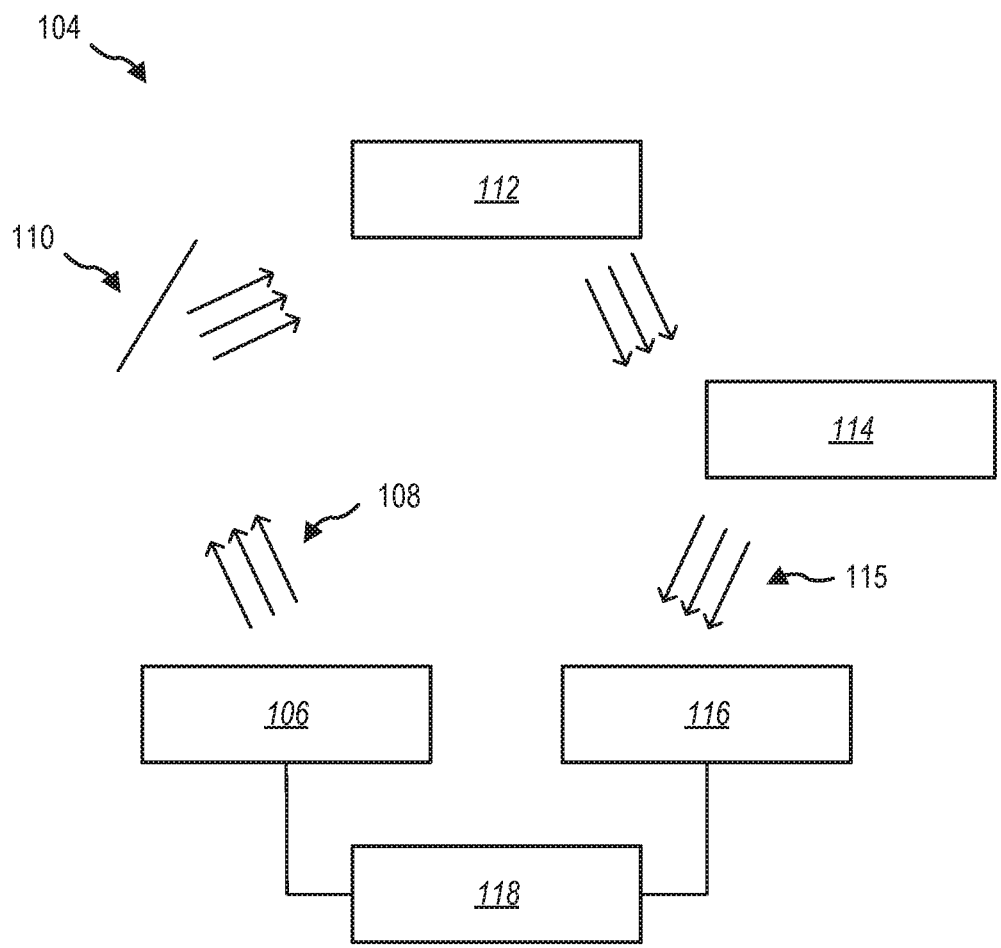
FIG. 2A is a representation of an imager with a detection circuitry, according to at least one embodiment of the present disclosure.

In some embodiments, as shown in FIG. 2A, a sensor/SiPM 104 may include at least one infrared (IR) light-emission device 106 that emits light 108 to illuminate at least one object 114. In some embodiments, the light-emission device 106 is configured to emit light toward at least one light-reflection device 110. The light-reflection device 110 may be configured to direct the light 108 to a waveguide 112 and the waveguide 112 may direct the light 108 toward the object 114. For example, the waveguide 112 may include a surface relief grating (SRG) or other optical element to direct the light 108 toward the object. In other embodiments, an imager 106 may include a light-emission device 110 configured to emit light 108 directly toward an object 114, directly to a waveguide 112, or directly to a light-reflection device 110 and toward an object 114 without a waveguide 112. For example, a LIDAR system may include an IR light-emission device 106 that emits light 108 toward a MEMS mirror light-reflection device 110. The MEMS mirror may then direct the light 108 directly toward an object 114. The reflected light may have a large dynamic range, as the intensity of the illumination decreases according to the square of the distance the light travels. For example, the path of the light to an object 1.0 meters away is 2.0 meters, so the intensity falls off by $1/(2.0\text{ m})^2$. However, as the distance increases, the exponential decrease in intensity contributes to a large dynamic range.

The object 114 may reflect at least some of the light 108 emitted from the light-emission device 106. The amount of light, if any, reflected from the object 114 may vary depending on a plurality of factors, including the part of the object 114 illuminated, the angle at which the light is incident to the object 114, the color of the object 114, and the reflectivity of the object 114.

In some embodiments, at least one detector with detection circuitry 116 may be configured to receive reflected light 115. The detection circuitry 116 may output a signal. In some embodiments, the output signal may be based at least in part on the amount of reflected light 115 received by the detection circuitry 116. In some embodiments, the detection circuitry 116 is in communication with a processing system 118. In some embodiments, the processing system 118 is in communication with the light emission device 106.

The communication may be through wired communication or wireless communication. In some embodiments, the processing system 118 synchronizes emitting light 108 from the light-emission device 106 with the detection circuitry 116 receiving reflected light 115. For example, the emitted light 108 may be a pulsed light, and synchronization of the emitted light 108 and the detection of the reflected light 115 may allow the correlation of the pulses.

In some embodiments, the processor 118 synchronizes the light-emission device 106 with the detection circuitry 116 outputting a signal. In some embodiments, a light-emission device and a detection circuitry may be synchronized through means other than a processing system.

In some embodiments, the light-emission device 106 may include an infrared (IR) laser or a single collimated IR laser. In other embodiments, the light-emission device 106 may comprise a light-emitting diode. In other embodiments, the light-emission device 106 may include other devices that emit light in an illumination wavelength range. The light-emission device 106 may emit an output light in the IR range while in other examples, the light-emission device 106 may emit light in the visible range in the ultraviolet range, in other wavelength ranges, or combinations thereof. In yet other embodiments, the light-emission device 106 may selectively emit light in one of a plurality of wavelength ranges.

In some embodiments, the light-reflection device 110 may be a movable reflection device, such as a microelectromechanical system (MEMS) mirror, configured to scan light across the waveguide 112 and/or object 114. In some embodiments, the processing system 118 may use collected information; including output signals from the detection circuitry 116, the position of the light-reflection device 110, the wavelength of the detected reflected light 115, or combinations thereof; to create an image of the object 114.

When a light-emission device operates at low power and light emitted from a light-emission device illuminates a human eye and experiences Lambertian reflection, a detection circuitry may receive few photons. At the same time, when photons experience specular reflection, a detection circuitry may receive two to four orders of magnitude more photons (or more) than when emitted light experiences Lambertian reflection. For this reason, an imager using a light-emission device operating at low power requires a detection circuitry that is both highly sensitive to small amounts of photons and capable of operating at a large dynamic range. In embodiments where a light-emission device illuminates a human eye, emitted light that experiences specular reflection may provide information regarding glints on the eye. Such information may be useful for cornea tracking and gaze tracking.

Figure 2B:
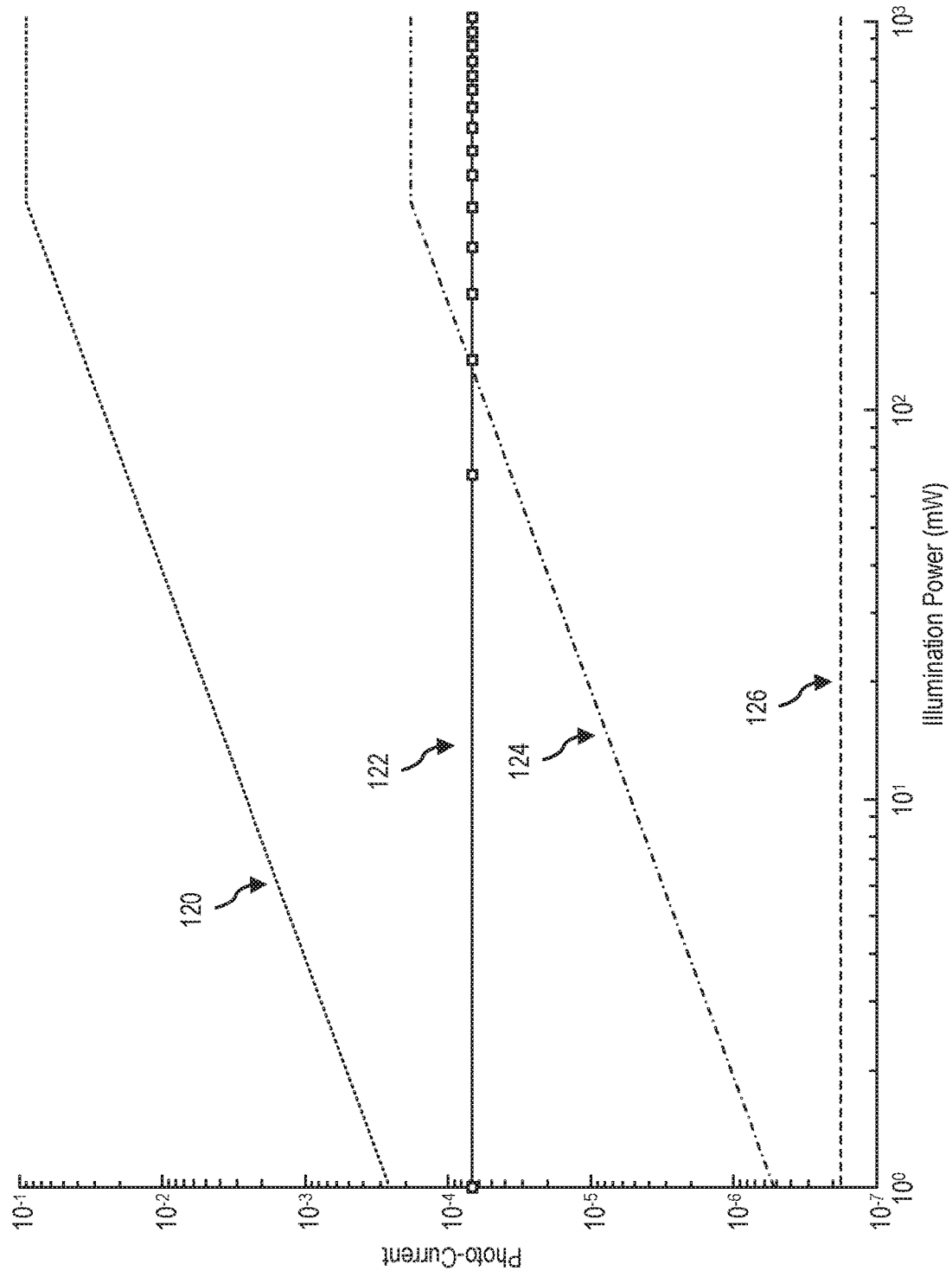
FIG. 2B is a plot of simulated photo-currents as a function of laser diode power, according to at least one embodiment of the present disclosure.

FIG. 2B illustrates the sensitivity and dynamic range that may be required in some embodiments. FIG. 2 is a plot showing simulated photocurrent (measured in Amps) outputted from a silicon photomultiplier as a function of illumination power, such as laser diode power (measured in mW). A laser diode emits light and a human eye may reflect some amount of the emitted light. Plot line 120 shows simulated photocurrent outputted from a silicon photomultiplier when the silicon photomultiplier receives light experiencing specular reflection. The specular reflection, or "glint", from a human eye may provide information as to the topography and/or orientation of the eye.

Plot line 122 shows simulated photocurrent outputted from a silicon photomultiplier when the silicon photomultiplier receives bright ambient light (such as daytime outdoor light). The bright ambient light of plot line 122 may introduce noise to the eye-tracking system. The active illumination of the eye or other object being imaged may be greater than the ambient light to provide sufficient signal to image the object.

When a silicon photomultiplier receives dim ambient light such as indoor ambient light, outputted photocurrent may drop two to three orders of magnitude from the simulated output current for bright ambient light. This will further increase the working dynamic range of silicon photomultiplier.

Plot line 124 shows simulated photocurrent when a silicon photomultiplier receives light experiencing Lambertian reflection from the same active illumination source as the plot line 120 simulating specular reflection. As shown, a difference of four to five orders of magnitude exists between (1) simulated photocurrent output when laser diode power is less than 1 mW and a silicon photomultiplier receives light that has experienced Lambertian reflection and (2) simulated photocurrent output when laser diode power is more than 100 mW (at which point FIG. 2B shows output photocurrent for light experiencing Lambertian reflection exceeding output photocurrent for bright ambient light of 17,500 Lux) and a silicon photomultiplier receives light that has experienced specular reflection. Plot line 126 shows simulated electrical noise current.

Using a MEMS mirror for eye imaging and tracking may introduce an additional challenge. As a MEMS mirror scans light emitted from an IR laser over each position of a human eye, reflected light may be used to reconstruct an image of the eye or track the movement of the eye. In some embodiments, a MEMS mirror may have a scanning frequency of 25 kHz (a total frame rate of 120 Hz), amounting to a line scan rate of 20 microseconds. In other embodiments, a MEMS mirror may have a different scanning frequency. An imager utilizing a MEMS mirror for eye imaging and tracking may not only need to be highly sensitive to small amounts of photons while still covering a large dynamic range (in some embodiments, a range of four to five orders of magnitude), it may also be desirable for an imager to output a signal fast enough to synchronize with the high scanning frequency of a MEMS mirror.

In some embodiments, it may be desirable for an imager that forms part of an HMD and is used for eye imaging and/or eye tracking to work in a condition of high frame rate, high scan rate of a scanning MEMS mirror and a limited power budget for an IR laser (due to eye-safety limits) and system (to save battery power). Such a system may result in very few photons returning to an imager's detection circuitry when light emitted on a human eye experiences Lambertian reflection. At the same time, the intensity difference between specular reflections (glints) and Lambertian reflections may be more than three to four orders of magnitude. A detection circuitry according to the present disclosure may work in a photon-sparse environment, cover a large dynamic range, and synchronize and integrate with high frequency emissions from an IR laser reflected by a MEMS mirror.

Figure 3:
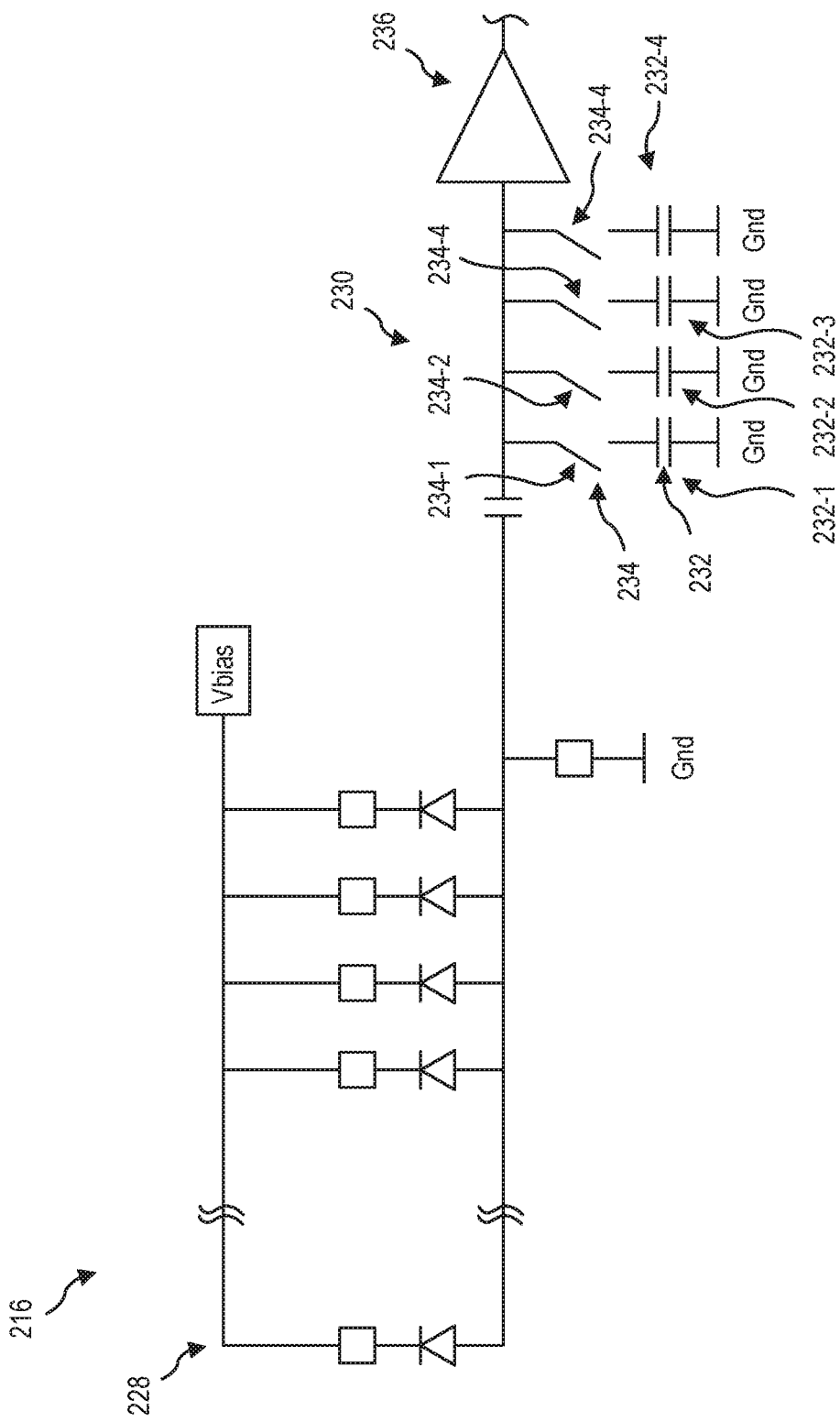
FIG. 3 is a schematic representation of a detection circuitry that includes a switchable array with capacitors, according to at least one embodiment of the present disclosure.

In one potential embodiment, as shown in FIG. 3, a detection circuitry 216 may include a photomultiplier 228 and a signal converter 236. In FIG. 3, the signal converter 236 is an analog to digital converter (ADC). In some embodiments, the signal converter 236 may be a ten-bit ADC. In other embodiments, a signal converter may be a transimpedance amplifier (TIA), as will be described herein. In some embodiments, the photomultiplier 228 may comprise a silicon photomultiplier. In some embodiments, a silicon photomultiplier has an array of avalanche photodetectors acting in Geiger mode that are connected in parallel. When one of the photodetectors detects a photon, the photodetector is switched into avalanche breakdown mode, triggering an output current. An on-chip quenching resistor rapidly quenches the photodetector. As each of the photodetectors operate in parallel, the current from each photodetector is read in parallel, making it possible to generate a signal with an extremely high dynamic range. For the same input, a photomultiplier may output three to four orders of magnitude more charge than a PIN diode sensor. A silicon photomultiplier may have a faster response time than a PIN diode sensor. In some embodiments, a silicon photomultiplier may have photodetector cells that are ten by ten micron square. In at least one embodiment, a silicon photomultiplier may be 1 mm². In other embodiments, a silicon photomultiplier may have an area greater than 1 mm². In yet other embodiments, a silicon photomultiplier may have an area less than 1 mm².

Conventionally, silicon photomultipliers output to a TIA or an ADC. Both TIAs and ADCs have limited dynamic range. Signals on the low end of an ADC's range may suffer from quantization error. Analog signal amplification alone does not solve this issue because analog amplification also introduces noise into a signal. Dynamic range limits lead to either low maximum signal level for an ADC with corresponding saturation or increased operating range but with increased quantization error.

In some applications, to overcome dynamic range limits of an ADC or a TIA, a system may change the gain of an ADC or a TIA. But changing the gain of an ADC or a TIA is too slow to synchronize with a MEMS mirror scanning at a frequency of 25 kHz.

In order to increase the dynamic range of an ADC or TIA and at a speed that allows for synchronization with a MEMS mirror, in some embodiments the detection circuitry 116 includes a switchable array 230 in electrical communication with the photomultiplier 116 and the signal converter 236. In some embodiments, the switchable array 230 includes at least two switchable elements 232 with each switchable element having an associated switch 234. In the embodiment shown in FIG. 3, the switchable elements 232 are capacitors, and the switchable array 230 includes four capacitors 232-1, 232-2, 232-3, and 232-4. In the embodiment shown in FIG. 3, a first switch 234-1 is associated with a first capacitor 232-1, a second switch 234-2 is associated with a second capacitor 232-2, a third switch 234-3 is associated with a third capacitor 232-3, and a fourth switch 234-4 is associated with a fourth capacitor 232-4. Each switch has an open state and a closed state. In an open state, a switch does not conduct current. In a closed state, a switch can conduct current. Each switch shown in FIG. 3. is in an open state. Each capacitor 232-1, 232-2, 232-3, and 232-4 has a different capacitance. In some embodiments, each of the capacitances may be multiple of the previous. For example, the fourth capacitor 232-4 may have a fourth capacitance of C4; the third capacitor 232-3 may have a third capacitance of C3, where C3=10×C4; the second capacitor 232-2 may have a second capacitance C2, where C2=10×C3=100×C4; and the first capacitor 232-1 may have a first capacitance C1, where C1=10×C2=100×C3=1000×C4. In other embodiments, each of the capacitances may be multiples of one another greater than 10. In yet other embodiments, each of the capacitances may be multiples of one another less than 10. In further embodiments, each of the capacitances may be different multiples of one another. For example, the fourth capacitor 232-4 may have a fourth capacitance of C4; the third capacitor 232-3 may have a third capacitance of C3, where C3=5×C4; the second capacitor 232-2 may have a second capacitance C2, where C2=2×C3=10×C4; and the first capacitor 232-1 may have a first capacitance C1, where C1=3×C2=6×C3=30 C4.

The amount of voltage stored in a capacitor is proportional to the stored charge (Q=C*V, where Q is the stored charge, C is the capacitance, and V is the measured voltage). For a fixed amount of charge provided, measured voltage is inversely proportional to the capacitance.

A switchable array comprising more than one capacitor, each capacitor having a different capacitance value and each capacitor having an associated switch, allows a switchable array—depending on the capacitor chosen—to output different measured voltages for the same input current (i.e., amount of charge). Switches may be used to select which capacitor to place in electrical communication with a photomultiplier and a signal converter. Determining which switch to place in a closed state may be based on which capacitor is appropriately matched to the desired signal level for an ADC.

In one potential embodiment, use of the switchable array 230 increases the effective dynamic range of the signal converter 236 and reduces quantization error of the signal converter 236. Moreover, in some embodiments, the switchable array 230 can switch within tens of nanoseconds, allowing for dynamic switching within the line scan rate of a MEMS mirror while maintaining full resolution. In some embodiments, the a switch may include and/or be an n-type field-effect transistor (nFET) or other electronic switchable device, allowing for switching times <10 ns.

The detection circuitry 228 may be used, among other applications, for eye tracking, eye imaging, iris identification, glint tracking, low-light imaging, low-light, large dynamic range imaging systems.

The number of switchable elements may depend on the application and expected dynamic range needed. In some embodiments, a switchable array has enough switchable elements to cover the needed dynamic range with 50% overlap between switchable elements. In other embodiments, a switchable array has a number of switchable elements sufficient to cover the needed dynamic range and have at least one order of magnitude overlap between switchable elements.

For example, assuming a 5 ns electrical pulse, this corresponds to 50 pJ. In at least one embodiment, to measure 1 V from this signal, the device uses a 50 pF capacitance of the selected capacitor. For example, a switchable array may include switchable elements of 1 pF, 10 pF, 100 pF, and 1000 pF. In other examples, an array may use lower capacitance values for longer electrical pulses or slower sampling rates, e.g., 10 fF or less. In yet other examples, an array may use higher capacitance values for shorter electrical pulses or faster sampling rates, e.g., 100 nF or greater. In other embodiments, different criteria may be used to select the number of switchable elements.

In some embodiments, a detection circuitry may output signal to a processing system, a computer system, or other device. In some embodiments, a processing system uses signals outputted by a detection circuitry and including information from the phase and/or position of the scanning MEMS mirror to reconstruct an image of an object, such as an eye. In other embodiments, a processing system uses signals outputted by a detection circuitry to track eye movement.

In some embodiments, emitting light from a light-emission device is synchronized with a signal converter outputting a signal. In some embodiments, each capacitor within a switchable array is cleared or quenched after a signal converter outputs a signal.

Figure 4:
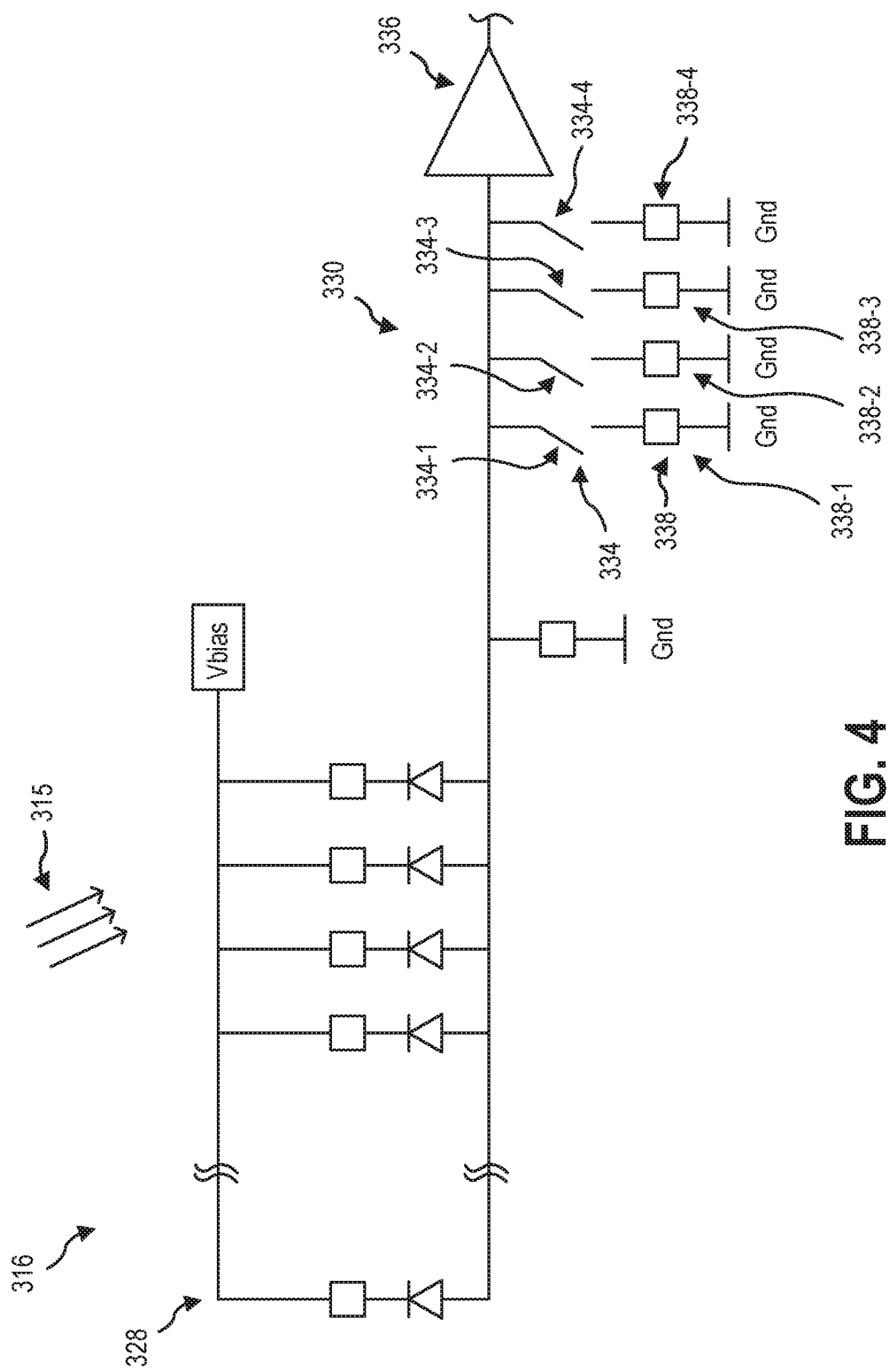
FIG. 4 is a schematic representation of a detection circuitry that includes a switchable array with resistors, according to at least one embodiment of the present disclosure.
Figure 5:
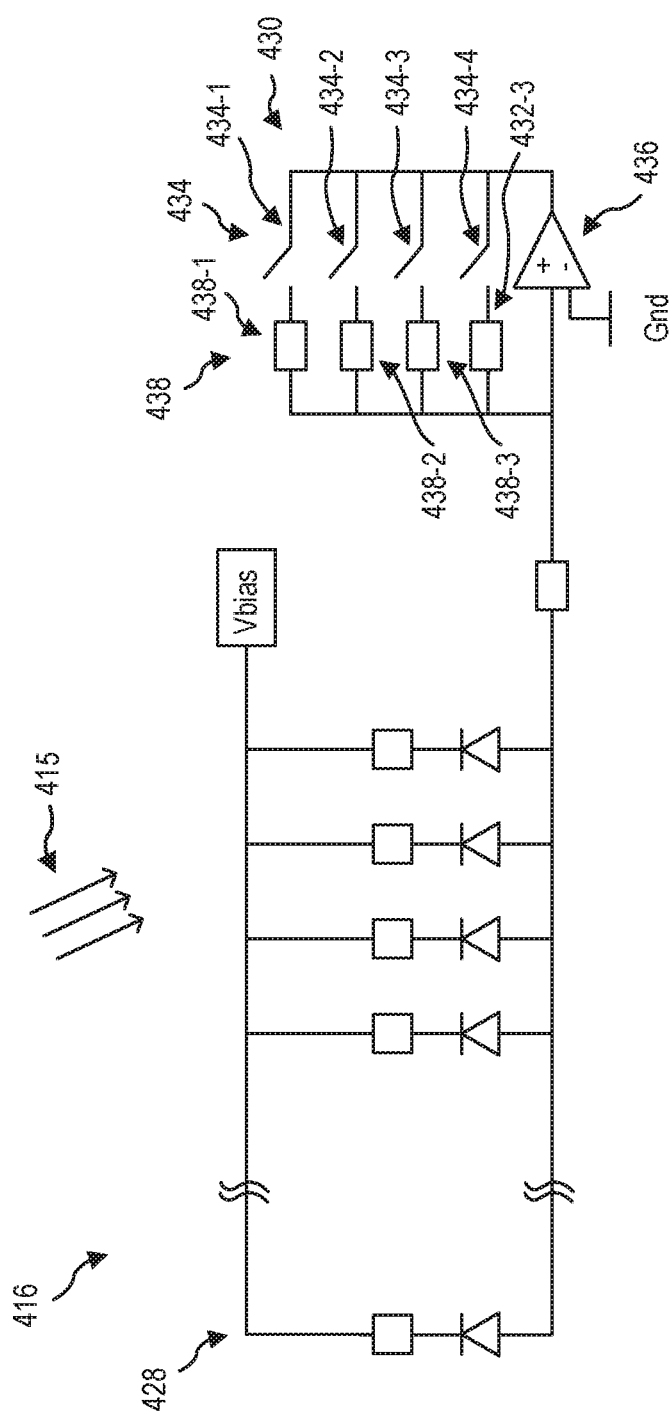
FIG. 5 is a schematic representation of a detection circuitry that includes a switchable array with resistors, according to at least one embodiment of the present disclosure.

FIG. 4 schematically illustrates a potential embodiment of a detection circuitry 316. A photomultiplier 328 receives reflected light 315. In some embodiments, the photomultiplier 328 is a silicon photomultiplier. The photomultiplier 328 is in electrical communication with a switchable array 330. The switchable array 330 includes at least two switchable elements 338, each switchable element 338 having an associated switch 334. In the embodiment shown, the switchable elements 338 are resistors. In some embodiments, the switchable array 330 includes four resistors 338-1, 338-2, 338-3, and 338-4 and four switches 334-1, 334-2, 334-3, and 334-4. In the embodiment shown in FIG. 5, a first switch 334-1 is associated with a first resistor 338-1, a second switch 338-2 is associated with a second resistor 338-2, a third switch 334-3 is associated with a third resistor 338-3, and a fourth switch 334-4 is associated with a fourth resistor 338-4. Each switch 334 has an open state and a closed state. The switchable array 330 is in electrical communication with a signal converter 336. In FIG. 5, the signal converter 336 is an ADC.

As described in relation to FIG. 3, while FIG. 4 illustrates a switchable array 330 with four switchable elements 334-1, 334-2, 334-3, 334-4, in other embodiments, a switchable array 330 may include any number of switchable elements 338 to cover the dynamic range desired of the intended application. For example, Lambertian reflection of a 10 mW illumination assuming provides 10 uA of current. In some embodiments, a switchable array 330 may include switchable elements 334-1, 334-2, 334-3, 334-4 of 1 Mega-ohm, 100 Kilo-ohms (Kohm), 10 Kohm and 1 Kohms to allow the detection of a 1V signal. In other examples, an array may use lower resistance values for longer electrical pulses or slower sampling rates. In yet other examples, an array may use higher resistance values for shorter electrical pulses or faster sampling rates. In other embodiments, different criteria may be used to select the number of switchable elements.

FIG. 5 schematically illustrates another potential embodiment of a detection circuitry 416. A photomultiplier 428 receives reflected light 415. In some embodiments, the photomultiplier 428 is a silicon photomultiplier. The photomultiplier 428 is in electrical communication with a switchable array 430. The switchable array 430 includes at least two switchable elements 438, each switchable element 438 having an associated switch 434. In the embodiment shown in FIG. 5, the switchable element 438 is a resistor. The switchable array 430 includes four resistors 438-1, 438-2, 438-3, and 438-4 and four switches 434-1, 434-2, 334-3, and 434-4. In the embodiment shown in FIG. 5, a first switch 434-1 is associated with a first resistor 438-1, a second switch 438-2 is associated with a second resistor 438-2, a third switch 434-3 is associated with a third resistor 438-3, and a fourth switch 434-4 is associated with a fourth resistor 438-4. Each switch 434 has an open state and a closed state. The switchable array 430 is in electrical communication with a signal converter 436. In the embodiment shown in FIG. 6, the signal converter 436 is a TIA.

Figure 6:
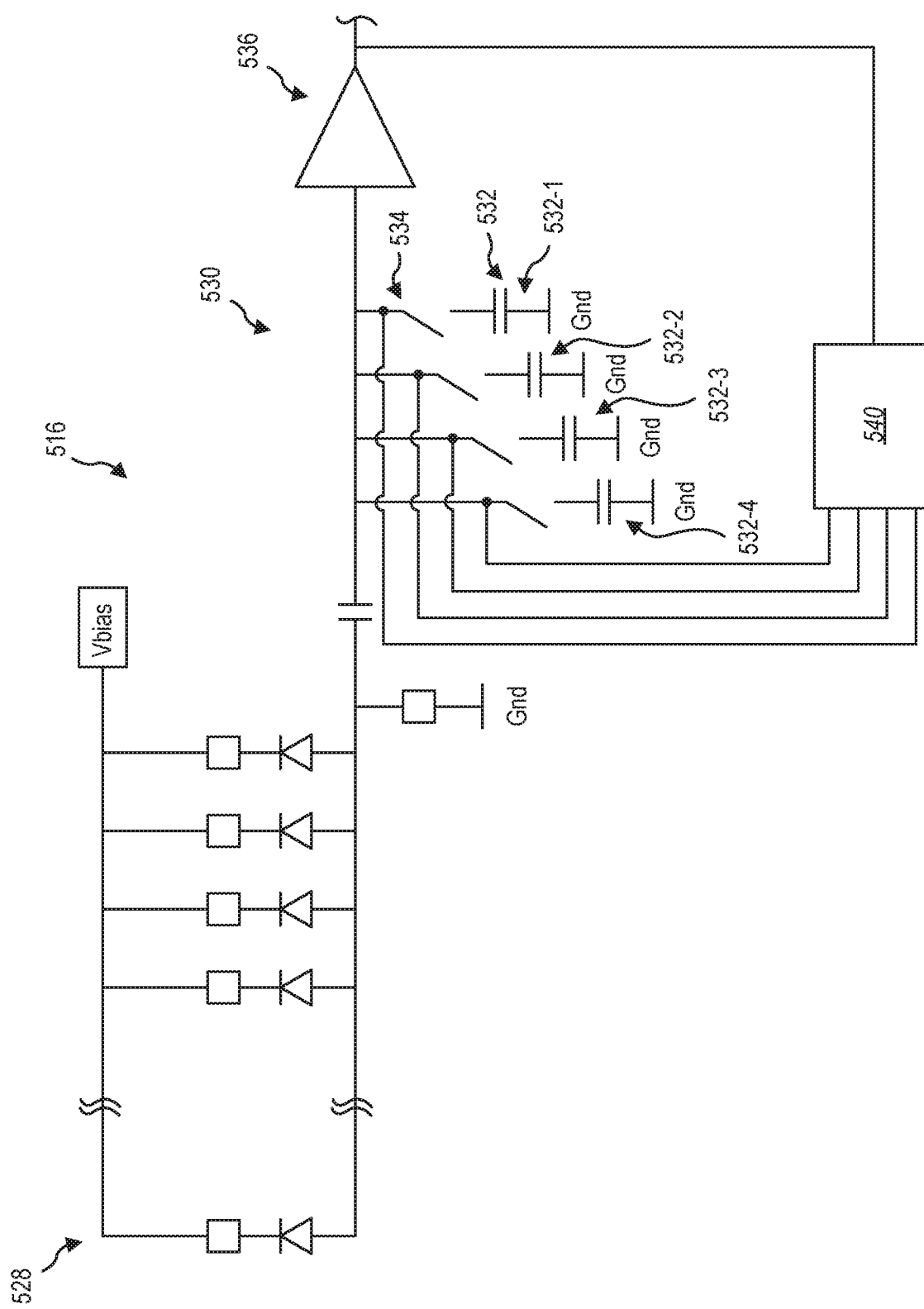
FIG. 6 is a schematic representation of a detection circuitry that includes a microcontroller, according to at least one embodiment of the present disclosure.

FIG. 6 illustrates yet another a potential embodiment of a detection circuitry 516. The detection circuitry 516 includes a microcontroller 540. The microcontroller 540 may be configured to toggle each switch 534 in a switchable array 530 to either an open state or a closed state. The microcontroller 540 may be configured to select one of the switchable elements 532-1, 532-2, 532-3, 532-4 (i.e., capacitor) to be used for storing charge outputted from a photomultiplier 528. In some embodiments, a signal converter 536 is in electrical communication with the microcontroller 540. In some embodiments, a microcontroller 540 may be in electrical communication with a processing system or other device. A microcontroller 540 may also receive information regarding the emission of light pulses. A signal converter 536 may be synchronized to the emission of light pulses. A detection circuitry may fully integrate signal outputted over a light pulse (thus increasing signal level) and may actively select a switchable element at least partially based on the expected input signal level.

Figure 7:
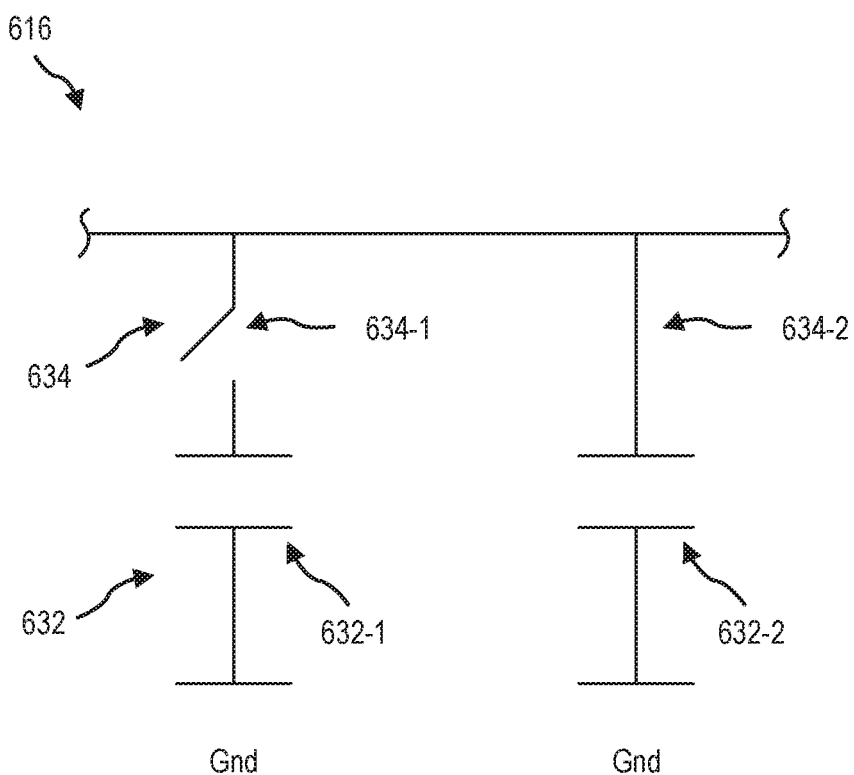
FIG. 7 is a schematic representation of a switchable array, according to at least one embodiment of the present disclosure.

FIG. 7 schematically depicts a switchable array 616 comprising two switchable elements 632, a first capacitor 632-1 and a second capacitor 632-2. Switch 634-1 is in an open state and switch 634-2 is in a closed state. In the depicted embodiment, the second capacitor 632-2 is in electrical communication with an input signal.

Figure 8:
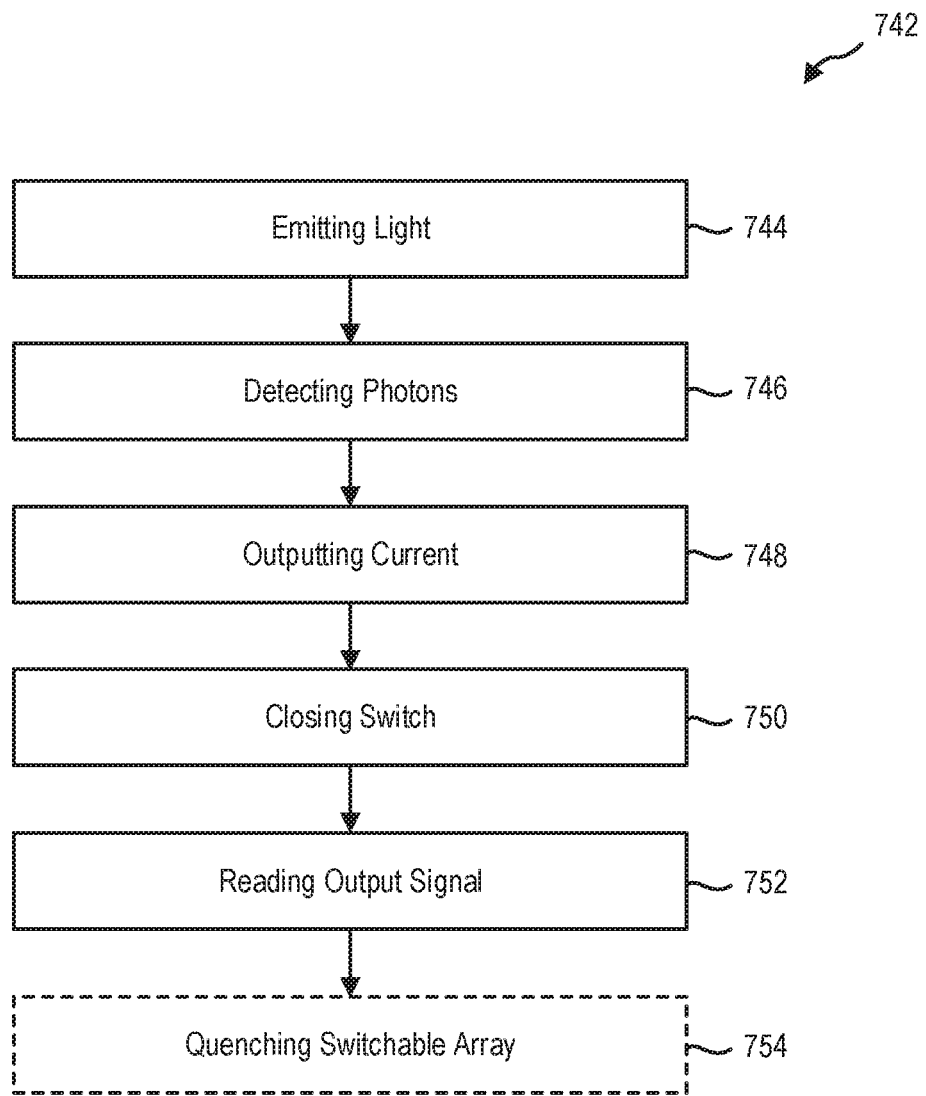
FIG. 8 is a flowchart illustrating an embodiment of a method of using a detection circuitry with a switchable array, according to at least one embodiment of the present disclosure.

FIG. 8 depicts a method 742 for imaging an object. According to one embodiment, an imager may include a light-emission device. The method 742 may include emitting 744 light from the light emission device. The light may be emitted directly on an object or may be emitted toward a reflection device and then directed toward an object. An object may reflect some amount of emitted light. The method 746 may include detecting 748 photons reflected by an object and outputting 748 a current proportional to the number of photons detected. A photomultiplier may be used to detect photons and a photomultiplier may output current to a switchable array. The method 742 may include closing 750 one switch in a switchable array. The method 742 may include reading 752 an output signal from the switchable array. In some embodiments, a signal converter, such as an ADC or a TIA, reads the output signal. In some embodiments, the method 742 may include quenching 754 the switchable array.

Various methods may be used for selecting which switch to place in a closed state. One potential approach may include cycling through switchable elements in a switchable array. For example, for an imager that utilizes a MEMS mirror, as the MEMS mirror scans light pulses across an object, each subsequent pixel could be indexed to a different switchable element. For a switchable array comprising two switchable elements, this approach means that the imager would cycle between a smaller capacitor and a larger capacitor. Thus, neighboring pixels would have a high sensing range and low sensing range. This implementation has the advantage of being simple to implement but has the disadvantage of reduced resolution.

Another approach utilizes the fact that typical images are slowly varying between regions of high and low intensity. Under this approach, when a light-emission device first emits light to illuminate an object, the switch associated with the smallest (most highly sensitive) capacitor is toggled to a closed state. For embodiments using a MEMS mirror, as the MEMS mirror scans light pulses across the object, the imager may compare signal outputted from the switchable array or the signal converter with predetermined threshold values. If the output signal meets or exceeds a threshold value, then the switch associated with the smallest capacitor is toggled to an open state and the switch associated with a larger capacitor is toggled to a closed state, thus increasing the maximum signal range. In some embodiments, a microcontroller toggles the switches. As the MEMS mirror continues to scan light pulses across the object, if the output signal falls below a threshold value, then a smaller capacitor is chosen. If the output exceeds a threshold value, then a larger capacitor is chosen. This latter approach is more complex than the former approach and may lose some resolution at high-contrast interfaces. Overall, however, the image resolution is better preserved than under the former approach.

Figure 9:
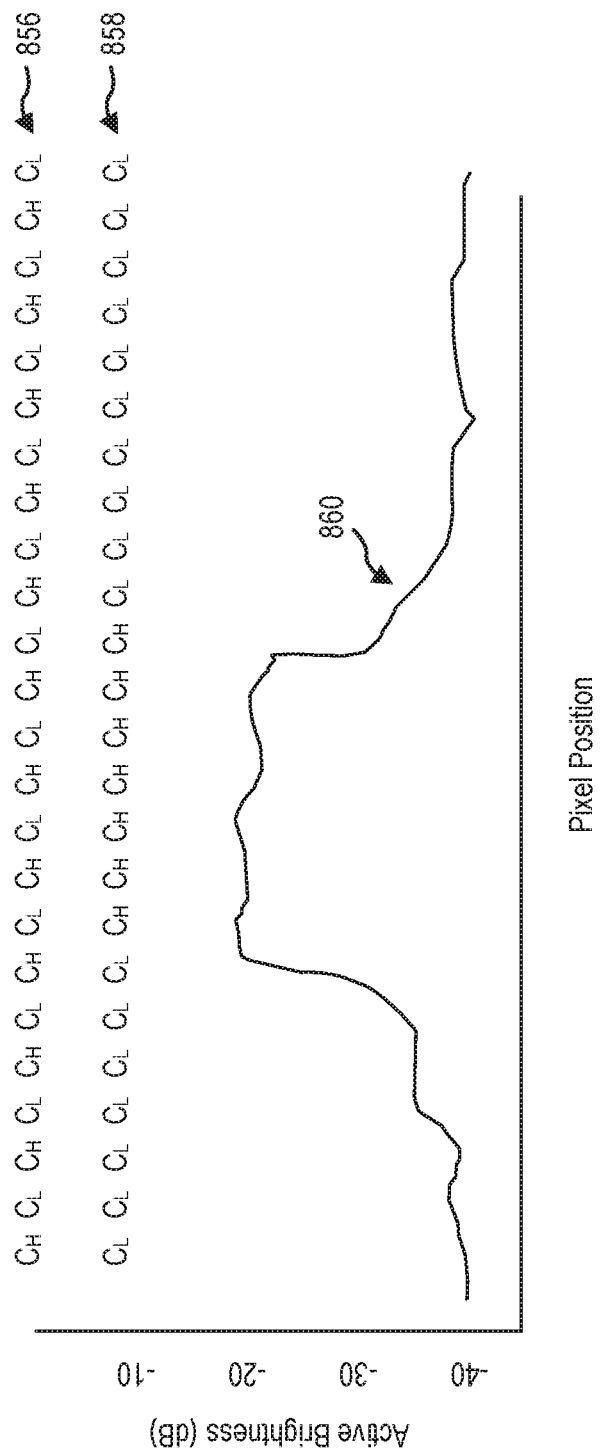
FIG. 9 is a representation of an embodiment of a method for choosing which capacitor to use in a switchable array, according to at least one embodiment of the present disclosure.

FIG. 9 illustrates how these two approaches may work for a switchable array that includes two capacitors. A plot line 860 represents a potential relationship between the location on an objected illuminated by light emitted from a light-emission device and brightness of reflected light. Under a first approach 856, the imager switches between the two capacitors (one having a smaller capacitance than the other). Under a second approach 858, the imager switches to the larger capacitor only once the output signal exceeds a given threshold value. The imager may then switch back to the smaller capacitor only once the output signal falls below a given threshold.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses, are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A light-sensing circuit, the circuit comprising:
   a solid state silicon photomultiplier; and
   a switchable array in electrical communication with the photomultiplier, the array including:
      a first capacitor having a first capacitance,
      a second capacitor having a second capacitance, the first capacitor and a second capacitor in electrical parallel, the first capacitance being different from the second capacitance,
      a first electrical switch associated with the first capacitor, and
      a second electrical switch associated with the second capacitor and in electrical parallel with the first electrical switch, each electrical switch having an open state and a closed state, where the electrical switch is configured to selectively provide electrical communication between the solid state silicon photomultiplier and an associated capacitor.

2. The circuit of claim 1, further comprising a signal converter in electrical communication with the switchable array.

3. The circuit of claim 2, the signal converter output synchronized with emission of light from a light emitting device.

4. The circuit of claim 1, the second capacitor having a capacitance at least ten times the capacitance of the first capacitor.

5. The circuit of claim 1, the first capacitor having a capacitance in the range 10 fF to 100 pF.

6. The circuit of claim 5, the second capacitor having a capacitance in the range 10 pF to 100 nF.

7. The circuit of claim 1, further comprising a microcontroller in electrical communication with the first switch and with the second switch and configured to toggle the first switch between an open state and a closed state and to toggle the second switch between an open state and a closed state.

8. A light-sensing circuit, the circuit comprising:
   a solid state silicon photomultiplier; and
   a switchable array in electrical communication with the photomultiplier, the array including:
      a first resistor and a second resistor, the first resistor having a first resistance and the second resistor having a second resistance, the first resistance being different from the second resistance,
      a first electrical switch associated with the first resistor, and
      a second electrical switch associated with the second resistor and in electrical parallel with the first electrical switch, each electrical switch having an open state and a closed state, where the electrical switch is configured to selectively provide electrical communication between the solid state silicon photomultiplier and an associated resistor.

9. The circuit of claim 8, further comprising a signal converter in electrical communication with the switchable array.

10. The circuit of claim 9, the signal converter synchronized with emission of light from a light emitting device.

11. The circuit of claim 8, the second resistor having a resistance ten times the resistance of the first resistor.

12. The circuit of claim 8, the first resistor having a resistance in the range 10 kohms to 10 Mohms.

13. The circuit of claim 12, the second resistor having a resistance in the range 0.1 Mohm to 100 Mohm.

14. The circuit of claim 8, further comprising a microcontroller in electrical communication with the first switch and the second switch and configured to toggle the first switch between an open state and a closed state and to toggle the second switch between an open state and a closed state.

15. A method for sensing light, the method comprising:
   emitting light toward an object using a light emission device;
   detecting photons reflected off the object using a solid state silicon photomultiplier;
   outputting current from the photomultiplier to a switchable array having a first switch and a second switch in electrical parallel;
   toggling to a closed state a single switch in the switchable array; and
   reading an output signal from the switchable array.

16. The method of claim 15, further comprising quenching the switchable array.

17. The method of claim 15, further comprising synchronizing emitting light from the light emission device with reading the output signal from the switchable array.

18. The method of claim 15, further comprising using a previous output signal in selecting a switch to toggle to a closed state.

19. The method of claim 18, further comprising comparing a previous output signal to threshold values and selecting a switch in the switchable array to toggle to a closed state based on the comparison.

20. The method of claim 15, further comprising using a microcontroller to control each switch in the switchable array.

* * * * *